(12) United States Patent
Joo

(10) Patent No.: US 6,396,097 B2
(45) Date of Patent: May 28, 2002

(54) SEMICONDUCTOR DEVICE INCLUDING CAPACITOR WITH IMPROVED BOTTOM ELECTRODE

(75) Inventor: Jae Hyun Joo, Chungcheongbuk-do (KR)

(73) Assignee: Hynix Semiconductor, Inc., Kyoungki-Do (KR)

( * ) Notice: Subject to any disclaimer, the term of this patent is extended or adjusted under 35 U.S.C. 154(b) by 0 days.

(21) Appl. No.: 09/794,143

(22) Filed: Feb. 28, 2001

Related U.S. Application Data

(62) Division of application No. 09/191,374, filed on Nov. 13, 1998, now Pat. No. 6,218,258.

(30) Foreign Application Priority Data

Jun. 30, 1998 (KR) .............................................. 98-25918

(51) Int. Cl.[7] .............................................. H01L 27/108
(52) U.S. Cl. ........................ 257/296; 257/306; 257/532; 257/310
(58) Field of Search ...................... 438/3, 240; 257/310, 257/532, 296, 300

(56) References Cited

U.S. PATENT DOCUMENTS

| | | |
|---|---|---|
| 5,191,510 A | 3/1993 | Huffman |
| 5,555,486 A | 9/1996 | Kingon et al. |
| 5,566,045 A | 10/1996 | Summerfelt et al. |
| 5,985,714 A * | 11/1999 | Sandhu et al. |
| 5,998,250 A * | 12/1999 | Andricacos et al. |
| 6,071,770 A * | 6/2000 | Roh |
| 6,180,447 B1 * | 1/2001 | Park et al. |

\* cited by examiner

*Primary Examiner*—Tuan H. Nguyen
(74) *Attorney, Agent, or Firm*—Birch, Stewart, Kolasch & Birch, LLP

(57) ABSTRACT

A method for fabricating a bottom electrode structure for a semiconductor capacitor. The method according to the present invention includes providing an interlayer insulating layer having a conductive plug formed therein. A first bottom electrode layer is formed on the interlayer insulating layer. An oxygen diffusion barrier layer is formed on the first bottom electrode layer. A second bottom electrode layer is formed on the first oxygen diffusion barrier layer. Thereafter, portions of the second bottom electrode layer, first oxygen diffusion barrier layer, and first bottom electrode layer are selectively removed to form a bottom electrode pattern. A third bottom electrode is formed on side walls of the bottom electrode pattern.

15 Claims, 11 Drawing Sheets

SEMICONDUCTOR DEVICE INCLUDING CAPACITOR WITH IMPROVED BOTTOM ELECTRODE

This application is a divisional of Application No. 09/191,374, filed on Nov. 13, 1998, now U.S. Pat. No. 6,218,258, the entire contents of which are hereby incorporated by reference and for which priority is claimed under 35 U.S.C. § 120; and this application claims priority of Application No. 98-25918 filed in KOREA on Jun. 30, 1998 under 35 U.S.C. § 119.

BACKGROUND OF THE INVENTION

1. Field of the Invention

The present invention relates to a memory device with a high device packing density, and more particularly, a semiconductor device including a capacitor with an improved bottom electrode and a method for fabricating the same.

2. Description of Related Art

In general, a semiconductor memory device is provided with a driving transistor and a capacitor which stores information therein. A volatile memory device, such as a dynamic random access memory (DRAM), stores information as an amount of charge in the capacitor. The amount of charge stored in the memory device, such as a DRAM, can be increased as follows: fabricating a three dimensional capacitor to increase an effective area of the capacitor; reducing a thickness of a dielectric in the capacitor; and using a dielectric having a higher dielectric constant.

Because increasing the stored charge by increasing the surface area and reducing the thickness of the dielectric requires complicated fabrication process steps, these techniques for increasing the stored charge are not generally adopted. Instead, the stored charge is increased by using high dielectric constant dielectric films. As the high dielectric constant dielectric films, $(Ba, Sr)TiO_3$ and $(Pb, La)(Zr, Ti)O_3$ may be used. The high dielectric constant dielectric films $BST[(Ba, Sr)TiO_3]$ are mostly used in DRAMs, and the high dielectric constant dielectric films $PZT(PbZrTiO_3)$ are mostly used in flash random access memories (FRAMs). If a high dielectric constant dielectric film such as BST is deposited on a silicon substrate directly, the silicon oxidizes making a defective contact or the BST film degrades due to a reaction between BST and Si. Because of this, when high dielectric constant dielectric films such as BST are used as the dielectric of a capacitor, a metal film such as Pt, Ru and Ir, which is less reactive, is usually used as the bottom electrode of the capacitor. This is applicable to both DRAMs and FRAMs. Because a complicated three dimensional electrode is not required for increasing an effective area of the capacitor if a high dielectric constant dielectric film such as BST or PZT is used, a memory device having a device packing density greater than the giga class can be fabricated according to the simple structure shown in FIG. 1.

As shown in FIG. 1, an interlayer insulation layer 2 is formed on a substrate 1, and has a contact hole formed therein. A plug 3 fills the contact hole, and a barrier 4 is formed on the substrate I and the plug 3. A bottom electrode 5 is formed on the barrier 4, and a dielectric 6 covers the interlayer insulation layer 2, the bottom electrode 5 and the barrier layer 4. A top electrode (not shown) is then formed on the dielectric 6.

When PZT or BST is used as the dielectric film 6, one of Pt, Ru and Ir is used as the bottom electrode 5. However, when Pt or Ru is used as the bottom electrode 5, the electrical characteristics of the capacitor change.

FIGS. 2A and 2B illustrates the use of Pt as the bottom electrode 5. Pt has a great work function, which results in excellent electrical characteristics and reduced leakage current, but Pt is oxygen permeable. As a result, oxidation at the barrier 4 and plug 3 interface takes place to form an oxide layer 7. Typically this oxidation consumes the barrier 4. The oxygen diffuses mostly along the Pt grain boundaries during the formation of the dielectric 6 causing oxygen holes in the dielectric 6, which degrades the electrical characteristics thereof. As shown in FIG. 2B, residue 8 from an etching process inhibits patterning.

FIG. 3 illustrates the use of Ru as the bottom electrode 5. When the dielectric film 6 is deposited, oxygen is absorbed from the dielectric 6 by the bottom electrode 5 as the bottom electrode 5 oxidizes. This forms an oxygen depletion layer between the dielectric 6 and the bottom electrode 5 resulting in poor electrical performance. To prevent this, the bottom electrode 5 is usually oxidized prior to deposition of the dielectric 6 so that the oxide layer formed therein prevents further oxidation using the oxygen in the dielectric 6. Typically, the Ru bottom electrode 5 is formed through etching with oxygen to form an oxide layer 9, RuOx, at the surface of the Ru bottom electrode 5 as shown in FIG. 3. Besides preventing the absorption of oxygen from the dielectric 6, the oxide of Ru, conductive. But the oxide of Ru also forms a rugged deposition surface as shown in FIG. 2B. Because of this rugged surface, the oxide layer 9 has poor electrical characteristics.

SUMMARY OF THE INVENTION

One object of the present invention is to provide a semiconductor device including a capacitor with an improved bottom electrode that overcomes the disadvantages and problems noted above with respect to the conventional art.

Another object of the present invention is to provide a semiconductor device including a capacitor with an improved bottom electrode and therefore improved electrical characteristics.

These and other objects are achieved by providing a semiconductor device having a capacitor with a bottom electrode, comprising: a substrate having an interlayer insulating layer formed thereon, the interlayer insulating layer having a contact hole formed therein, and a plug disposed in the contact hole; a first bottom electrode formed on a portion of the interlayer insulating layer and over the contact hole; a first oxygen diffusion barrier formed on the first bottom electrode; a second bottom electrode formed on the first oxygen diffusion barrier; and a third bottom electrode formed on sidewalls of the first bottom electrode, the first oxygen diffusion barrier and the second bottom electrode.

These and other objects are also achieved by providing a method of forming a semiconductor device having a capacitor with a bottom electrode, comprising: providing a substrate having an interlayer insulating layer formed thereon, the interlayer insulating layer having a contact hole formed therein, and a plug disposed in the hole; forming a first bottom electrode layer on the interlayer insulating layer over the hole; forming a first oxygen diffusion barrier layer on the first bottom electrode layer; forming a second bottom electrode layer on the first oxygen diffusion barrier layer; selectively removing portions of the second bottom electrode layer, the oxygen diffusion barrier layer and the first bottom electrode layer to form a bottom electrode pattern; and forming a third bottom electrode on sidewalls of the bottom electrode pattern.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Figure 1:
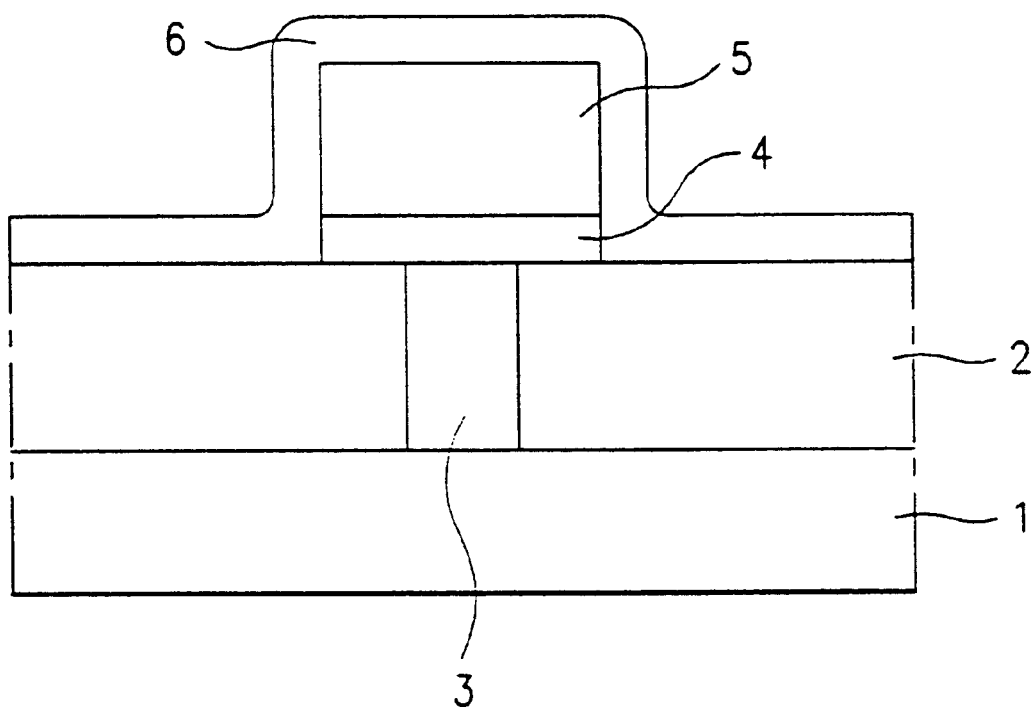
FIG. 1 illustrates a cross-section of a partially formed conventional capacitor in a semiconductor device.
Figure 2A:
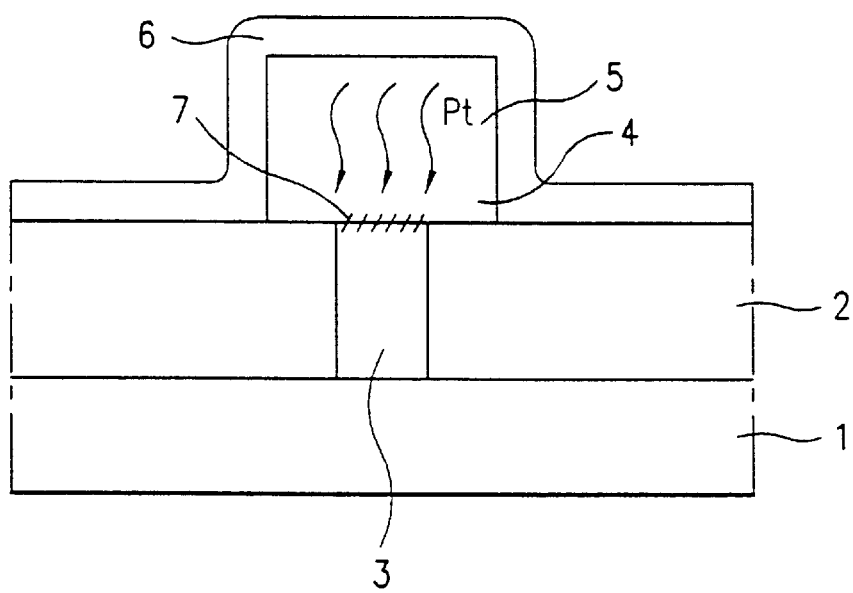
FIGS. 2A and 2B illustrate cross-sections of the conventional art capacitor using Pt as the bottom electrode.
Figure 2B:
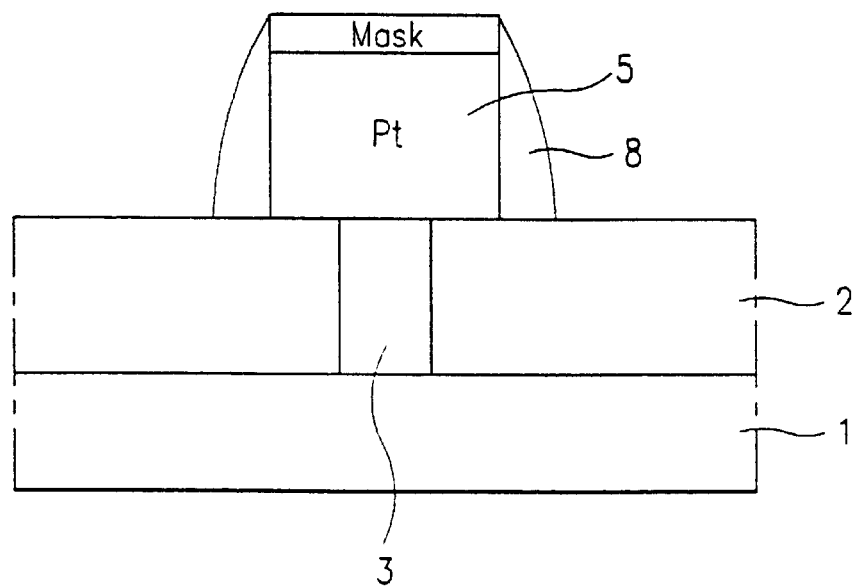
Figure 3:
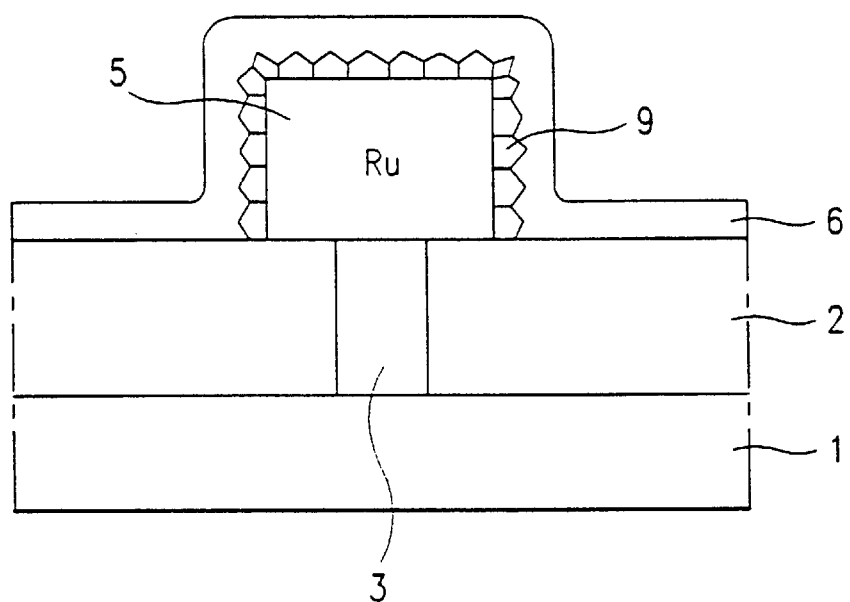
FIG. 3 illustrates a cross-section of the conventional art capacitor using Ru as the bottom electrode.
Figure 4:
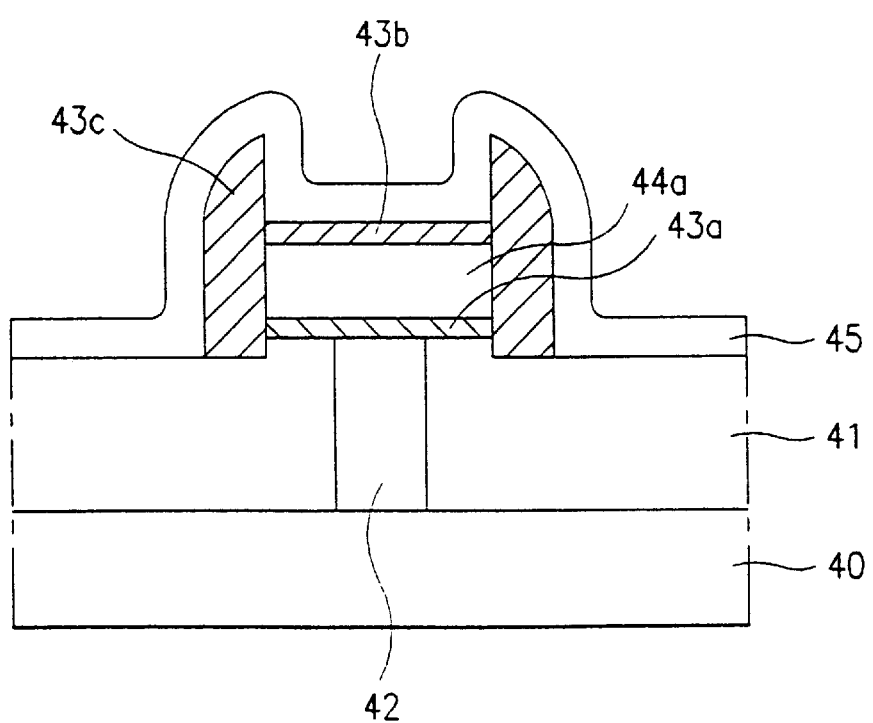
FIG. 4 illustrates a cross-section of a partially formed capacitor in a semiconductor device in accordance with a preferred embodiment of the present invention.

Reference will now be made in detail to the preferred embodiments of the present invention, examples of which are illustrated in the accompanying drawings. FIG. 4 illustrates a cross-section of a partially formed capacitor in a semiconductor device in accordance with a preferred embodiment of the present invention.

As shown in FIG. 4, an interlayer insulation layer 41 is formed on a semiconductor substrate 40, and has a contact hole formed therein. Typically, the semiconductor substrate 40 will already have cell transistors and the like formed thereon. A plug 42 fills the contact hole, and a first bottom electrode 43a is formed on a portion of the interlayer insulation layer 41 and the plug 42. Preferably, the plug 42 is formed of polysilicon, tungsten or Pt, and the first bottom electrode 43a is formed of a metal, the oxide of which is conductive, or the oxide of the metal.

An oxygen diffusion barrier 44a is formed on the first bottom electrode 43a, and a second bottom electrode 43b is formed on the oxygen diffusion barrier 44a. Preferably, the oxygen diffusion barrier 44a is silicon oxide or silicon nitride and the second bottom electrode 43b is formed of Pt to a thickness of 10 nm +−5%. The first bottom electrode 43a, the oxygen diffusion barrier 44a and the second bottom electrode 43b form a bottom electrode pattern.

A third bottom electrode 43c is formed as sidewalls of the bottom electrode pattern. Preferably the height of the third bottom electrode 43c is greater than the height of the bottom electrode pattern, and the third bottom electrode 43c is formed of Pt. A dielectric layer 45 is formed over the resulting structure, and an upper electrode (not shown) is formed thereon. Preferably, the dielectric layer 45 is a high dielectric constant dielectric such as BST or PZT.

The method for fabricating a semiconductor device having a capacitor with the improved bottom electrode of FIG. 4 will be described with reference to FIGS. 5A–5F and 6A–6E. FIGS. 5A–5F illustrate the process steps of the method for fabricating a semiconductor device having a capacitor with an improved bottom electrode in accordance with a preferred embodiment of the present invention, and FIGS. 6A–6E illustrate in detail the process steps for performing the bottom electrode patterning process step shown in FIG. 5D.

Figure 5A:
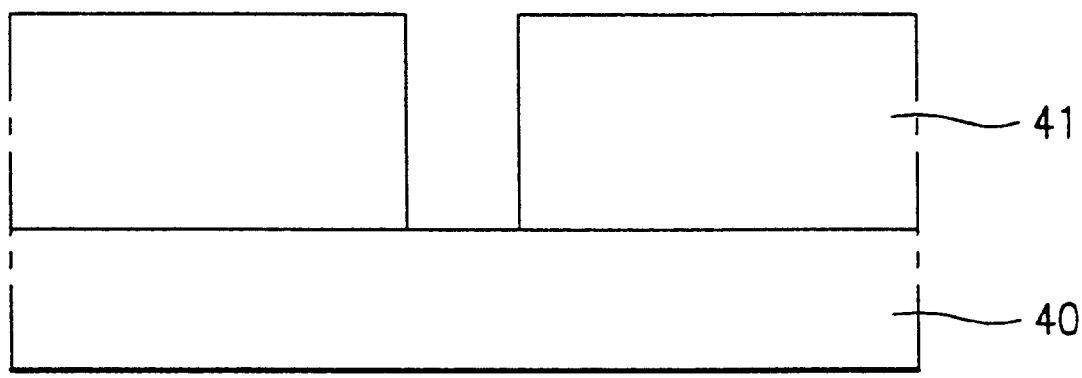
FIGS. 5A–5F illustrate the process steps of the method for fabricating a semiconductor device having a capacitor with an improved bottom electrode in accordance with a preferred embodiment of the present invention.

Referring to FIG. 5A, an interlayer insulation layer 41 is formed on a semiconductor substrate 40, and a portion thereof is selectively removed to form a contact hole therein. At this point in the process, the semiconductor substrate 40 will typically have cell transistors already formed therein.

Figure 5B:
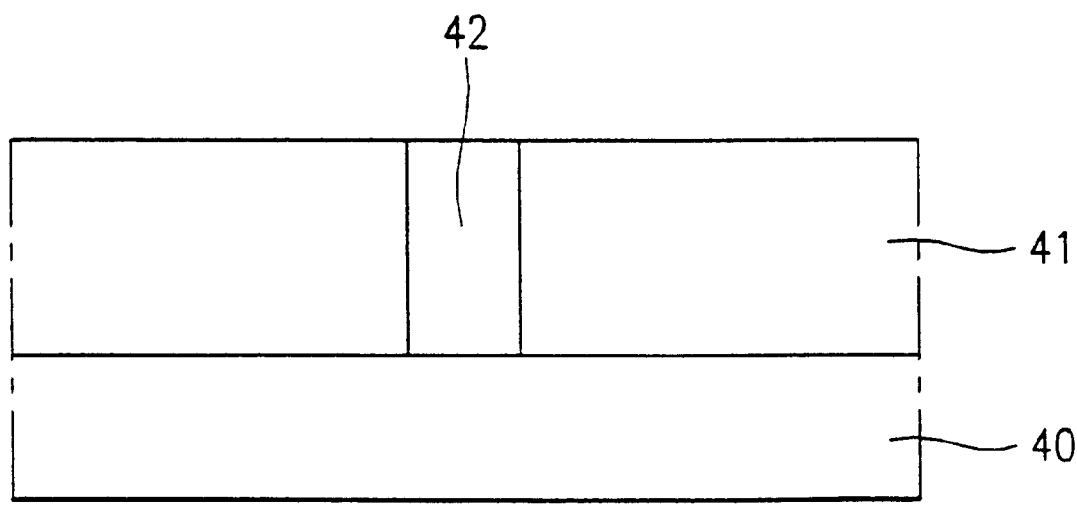

Then, as shown in FIG. 5B, a plug 42 is formed in the contact hole by depositing polysilicon, which has excellent step coverage, and performing etch back or chemical mechanical polishing (CMP) to expose the interlayer insulation layer 41. Instead of polysilicon, the plug 42 may be formed of tungsten or Pt.

Figure 5C:
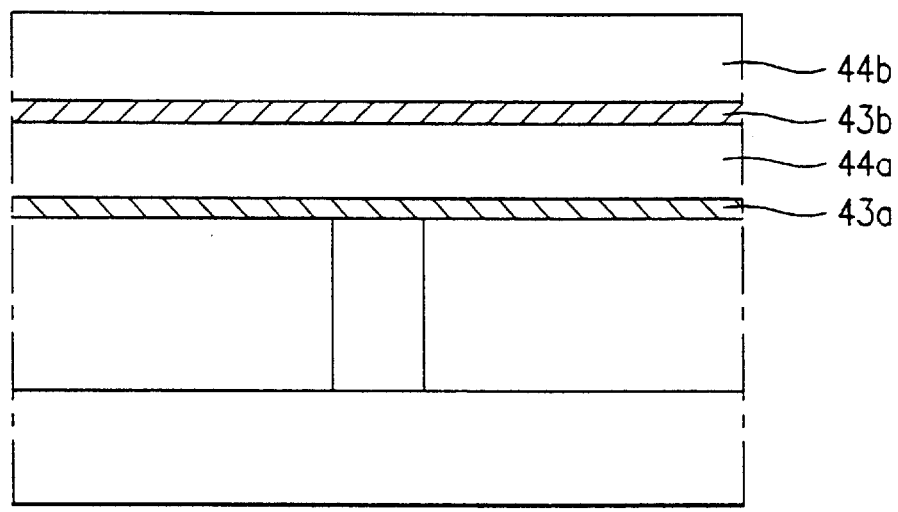

Next, as shown in FIG. 5C, a metal film, the oxide of which is conductive, or the oxide of the metal is deposited on a surface of the interlayer insulation layer 41 and the plug 42 to form a first bottom electrode layer 43a in electrical contact with the semiconductor substrate 40 via the plug 42. The first bottom electrode layer is preferably formed of Ru, Ir, Rh, Os, Sn and the like, or a mixture of these metals. Then an oxygen diffusion barrier 44a of silicon oxide or silicon nitride is formed on surface of the first bottom electrode layer 43a. A second bottom electrode layer 43b of Pt is formed on the oxygen diffusion barrier 44a. The second bottom electrode layer 43b is deposited to a thickness of 10 nm +−5% so that the Pt film can be etched in a following patterning process without leaving any residue. A silicon oxide film 44b, serving as a buffer layer, is formed on the second bottom electrode layer 43b.

Figure 5D:
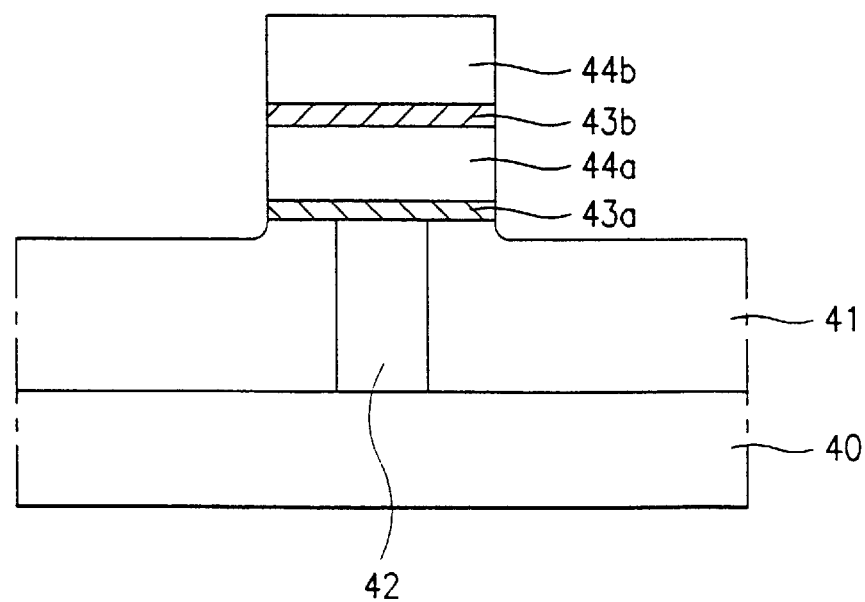
Figure 6A:
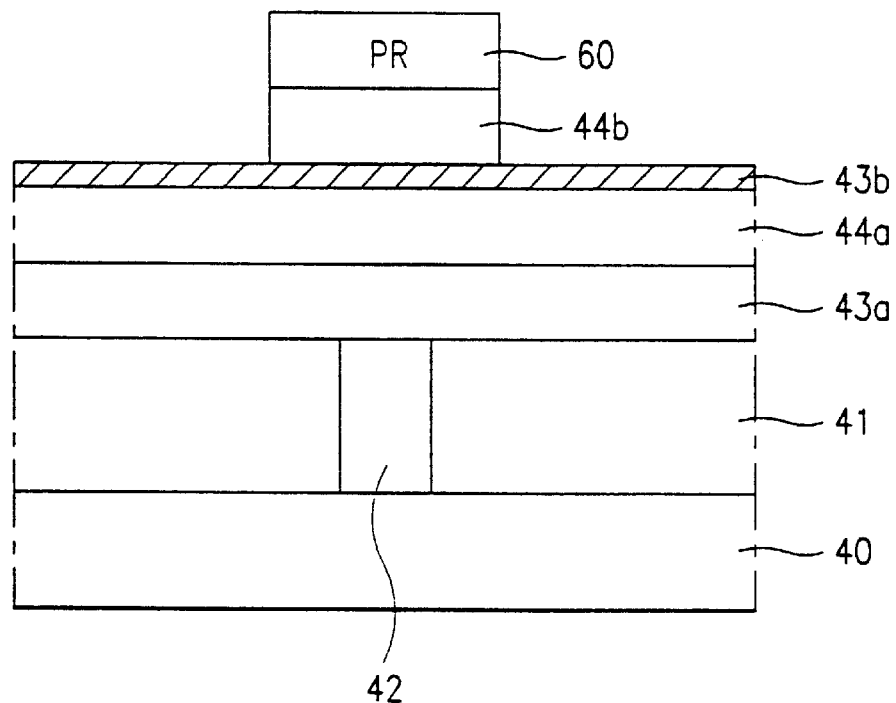
FIGS. 6A–6E illustrate in detail the process steps for performing the bottom electrode patterning process step shown in FIG. 5D.
Figure 6B:
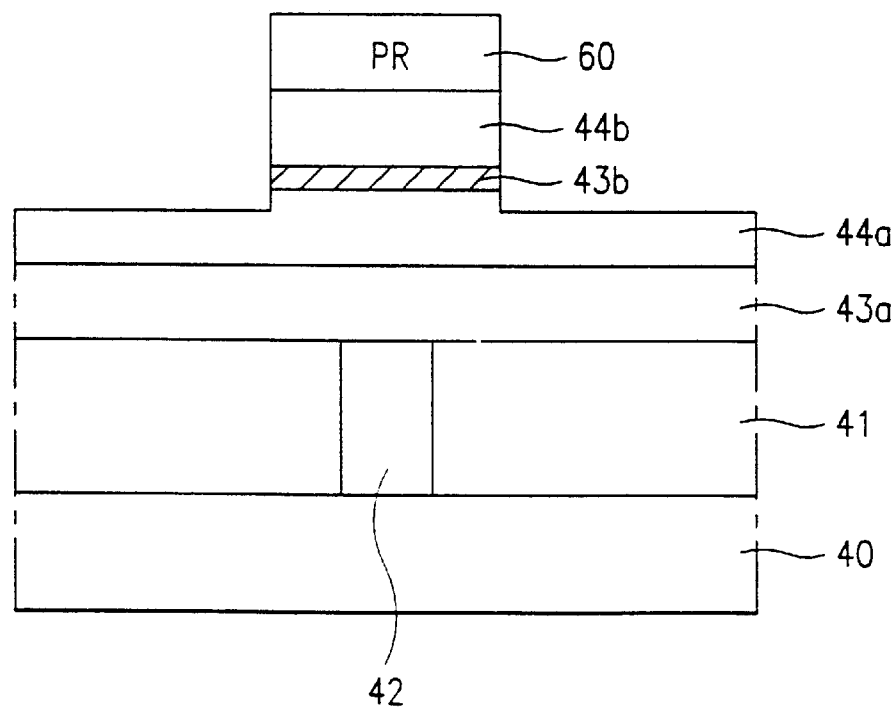

A patterning process is carried out to form the bottom electrode pattern shown in FIG. 5D. This patterning process will be described in detail with respect to FIGS. 6A–6E. As shown in 6A, a photoresist layer 60 is deposited and patterned by lithography. The patterned photoresist layer 60 is used as a mask to etch the silicon oxide film 44b using a gas, such as $CHF_3$, $CF_4$, $C_2F_6$, $C_2HF_5$, Ar, or $Cl_2$. Then, as shown in FIG. 6B, the second bottom electrode layer 43b is etched by sputtering. This etching process also results in the oxygen diffusion layer 44a being partially etched. As the second bottom electrode layer 43b is formed to a thickness of 10 nm +−5%, no residue from this etching step remains.

Figure 6C:
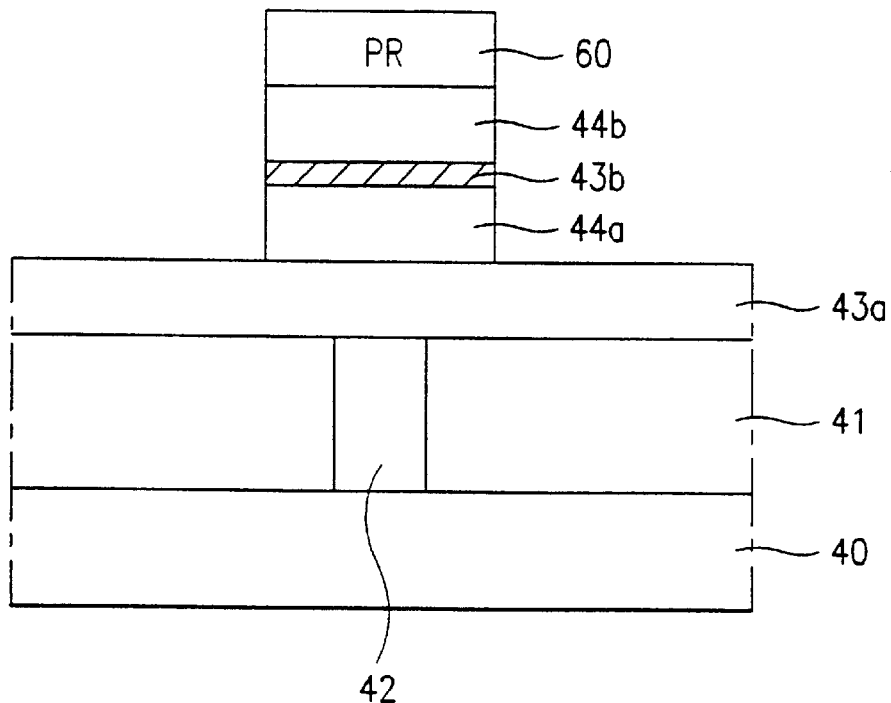
Figure 6D:
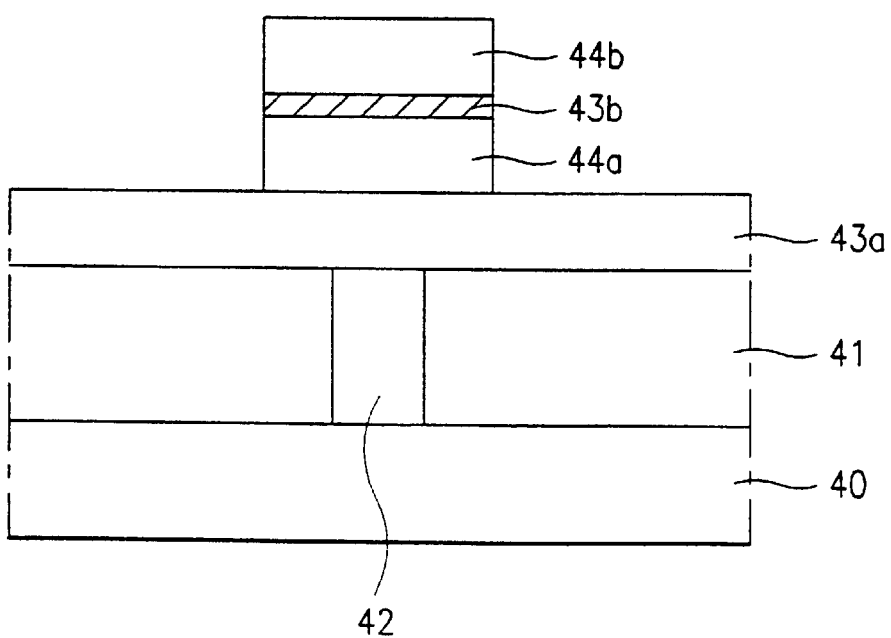
Figure 6E:
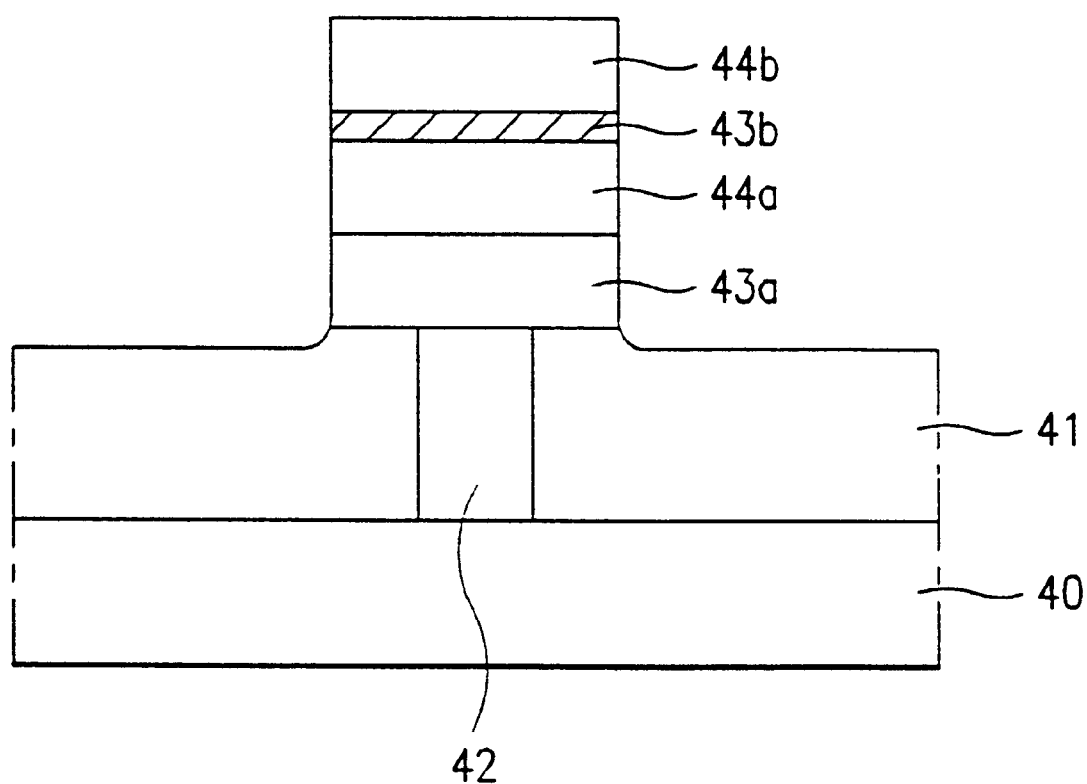

As shown in FIG. 6C, the oxygen diffusion barrier 44a is etched using a gas, such as $CHF_3$, $CF_4$, $C_2F_6$, $C_2HF_5$, Ar, or $Cl_2$. Then, as shown in FIG. 6D, the photoresist layer 60 is removed, and as shown in FIG. 6E, $O_2$ plasma is used to etch the first bottom electrode layer 43a and produce the bottom electrode pattern of FIG. 5D. The $O_2$ plasma etching results in the interlayer insulation layer 41 being partially etched as well.

Figure 5E:
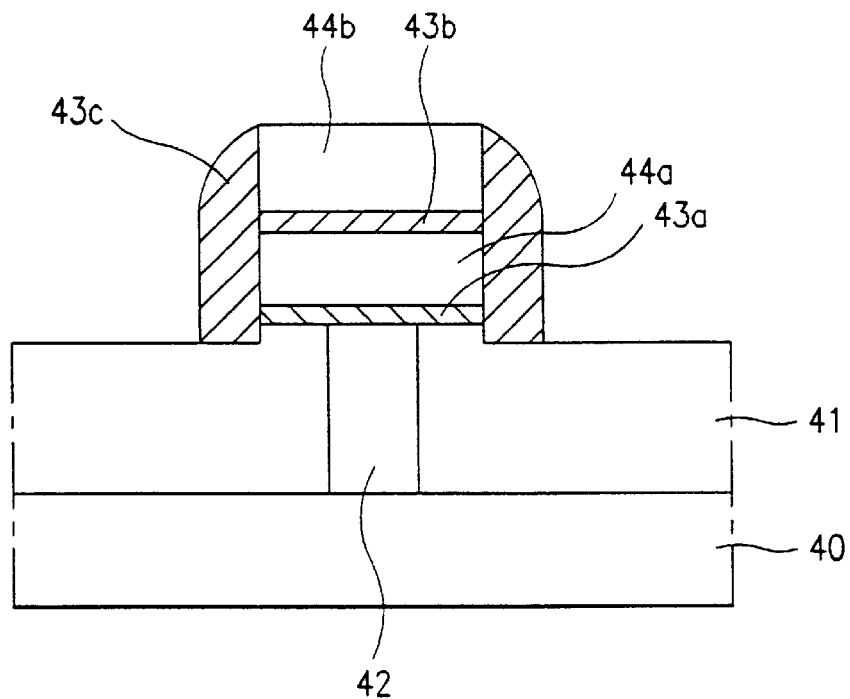

Referring to FIG. 5E, a Pt film is CVD or sputter deposited over the entire surface of the semiconductor substrate 40 and etched back to from a third bottom electrode 43c. The etch back leaves Pt film only at the sides of the bottom electrode pattern (i.e., the patterned silicon oxide film 44b, the second bottom electrode layer 43b, the oxygen diffusion barrier layer 44a, and the first bottom electrode layer 43a). As shown, the height of the third bottom electrode 43c is greater than the height of the bottom electrode pattern. Forming the third bottom electrode 43c to such a height increases the effective surface area thereof. Additionally, the total surface area of the third bottom electrode 43c is increased by the amount the interlayer insulation layer 41 was etched. Increasing the total surface area of the third bottom electrode 43a increases an effective area of the resulting capacitor; and therefore, increases the amount of charge the capacitor can store.

Figure 5F:
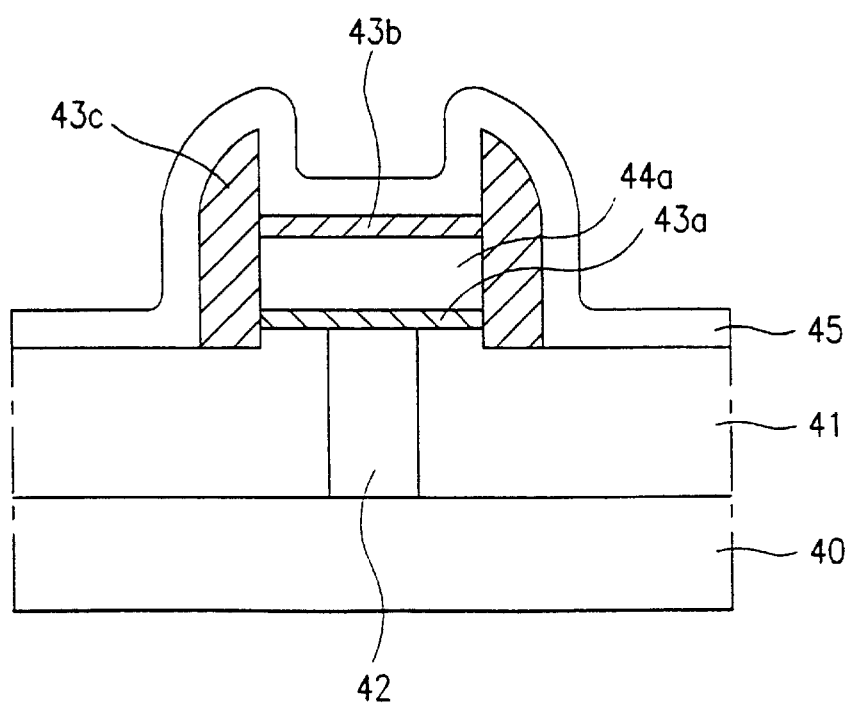

Optionally, after forming the third bottom electrode 43a, a heat treatment may be conducted in an oxygen ambient atmosphere to form an RuOx film between the third bottom electrode 43c and the first bottom electrode 43a. Then, as shown in FIG. 5F, the silicon oxide film 44b is removed and a dielectric film 45 is deposited. The dielectric film 45 is chemical vapor deposited to provide good step coverage. The dielectric film 45 may be formed of any high dielectric constant dielectric such as BST and PZT.

From the forgoing description, it will be recognized that the method according to the present invention is not limited to forming the bottom electrode of a capacitor as described above. Instead, various modifications to further improve the electrical characteristics thereof can be made. For example, FIGS. 7A–7C illustrate cross-sections of partially formed capacitors in accordance with further embodiments of the present invention.

Figure 7A:
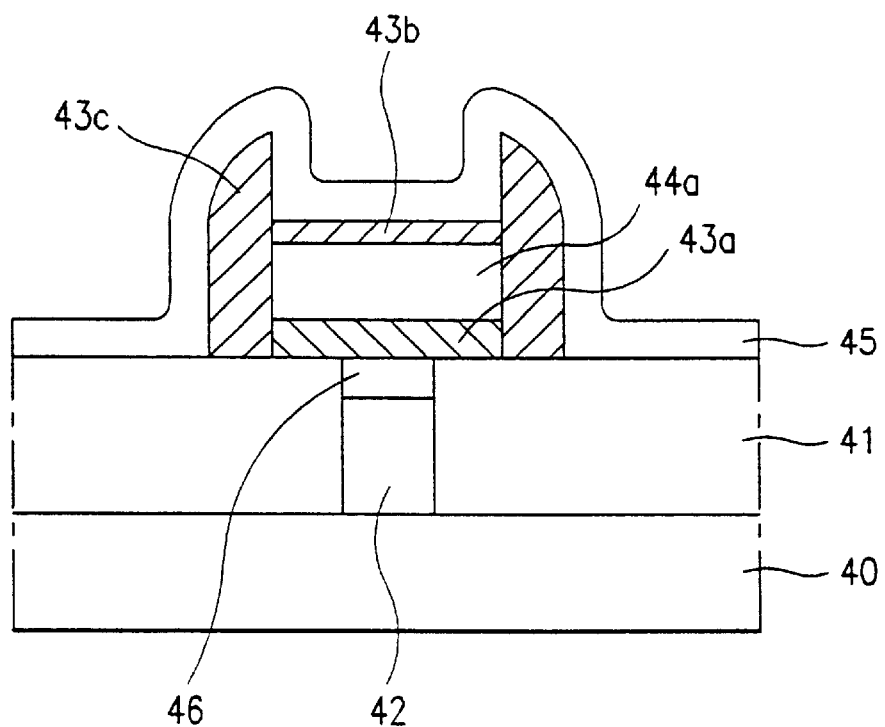
FIGS. 7A–7C illustrate further embodiments of a capacitor in a semiconductor device according to the present invention.

The capacitor of FIG. 7A has the same structure as the capacitor of FIG. 4, except that the plug 42 only partially fills the contact hole in the interlayer insulation layer 41. The remaining portion of the contact hole is filled with another oxygen diffusion barrier 46. Preferably, this oxygen diffusion barrier 46 is formed from one of TiN, TiW, TaN, and TiAlN.

Figure 7B:
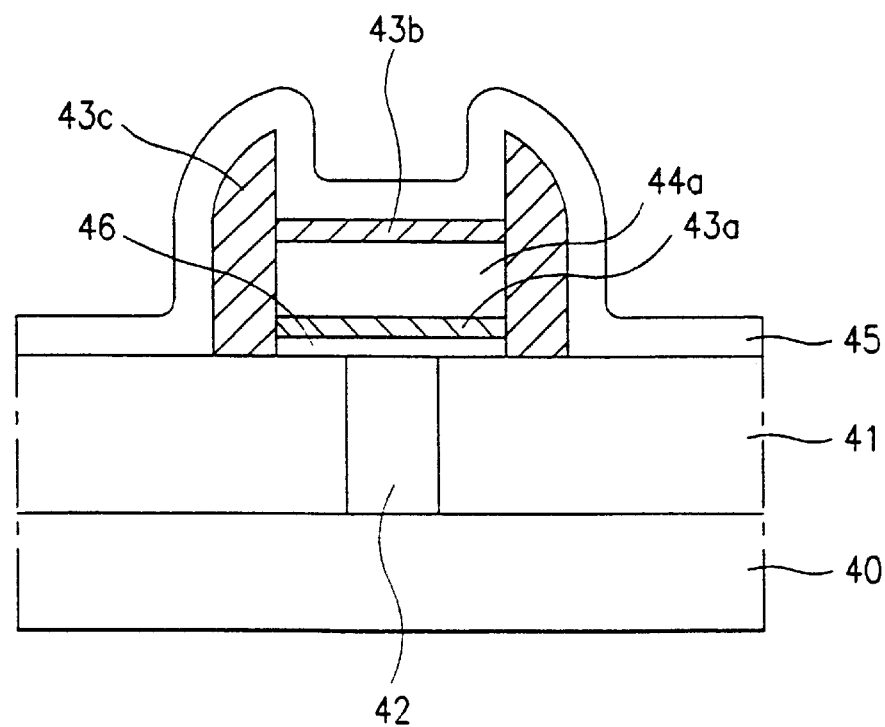

The capacitor of FIG. 7B also has the same structure as the capacitor of FIG. 4, except that another oxygen diffusion barrier 48 is disposed between (1) the first bottom electrode 43a and (2) the plug 42 and a portion of the interlayer insulation layer 41. Preferably, this oxygen diffusion barrier 48 is formed from one of TiN, TiW, TaN, and TiAlN.

Figure 7C:
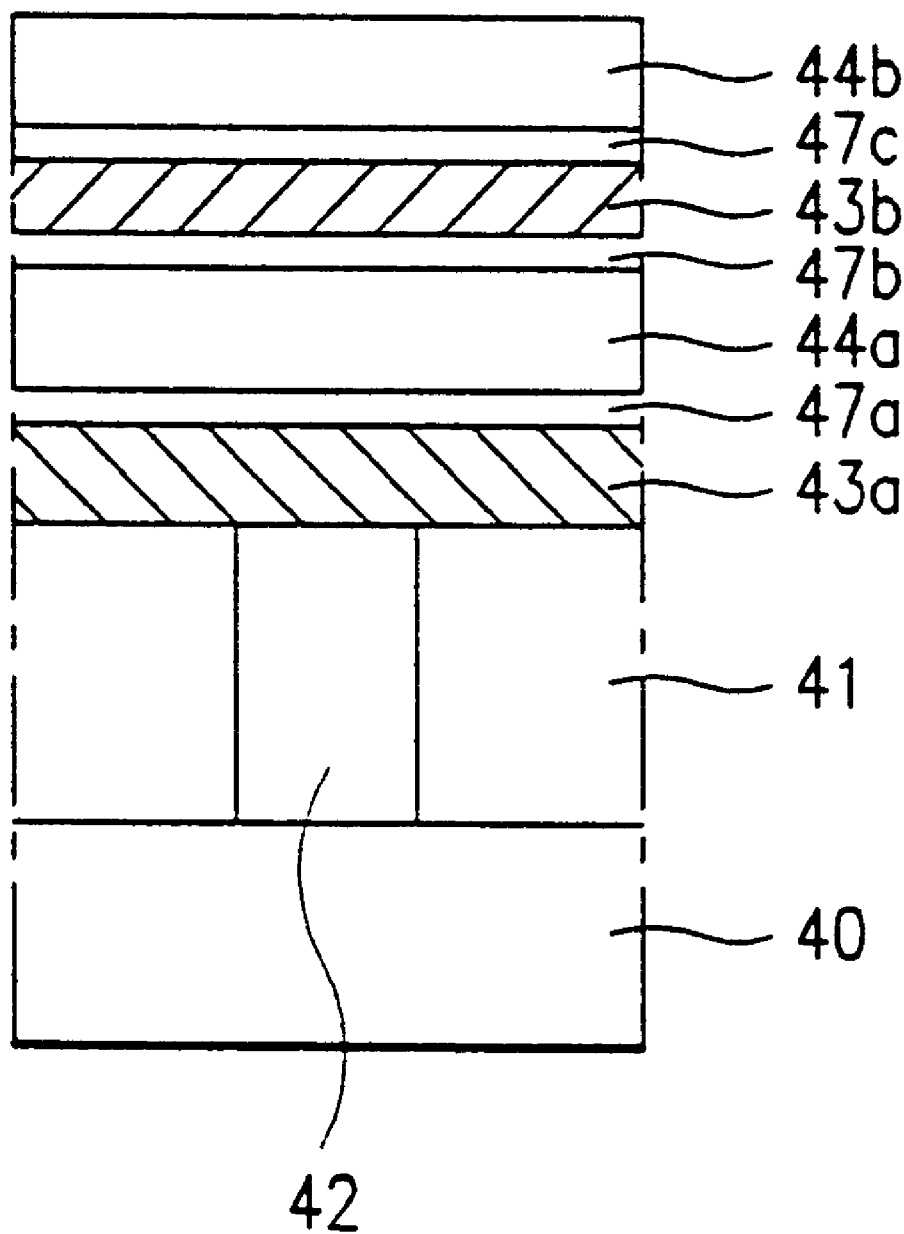

FIG. 7C illustrates a bottom electrode pattern the same as in FIG. 5D except that (1) a first adhesive 47a is disposed between the first bottom electrode 43a and the oxygen diffusion barrier 44a, (2) a second adhesive 47b is disposed between the oxygen diffusion barrier 44b and the second bottom electrode 43b, and (3) a third adhesive 47c is disposed between the second bottom electrode 43b and the silicon oxide layer 44b. Each of the first, second, and third adhesive layers 47a, 47b, and 47c is formed from Ti or Ta.

In the bottom electrode of a capacitor of the present invention, it is possible to differ a thickness of each layer to adjust contact resistance and the capacitor s effective area. Furthermore, an electrode layer of Pt film is formed in direct contact with the dielectric film having a high dielectric constant, and oxidation of the plug caused by oxygen diffusion due to the Pt film is inhibited. Namely, an oxygen diffusion barrier is provided in the bottom electrode for preventing oxygen diffusion from occurring during the dielectric film forming process, and the first bottom electrode is formed of a material, the oxide of which is conductive, to prevent lateral diffusion of oxygen through the Pt film during the dielectric film forming process.

The present invention further has the following advantages: first, the use of Pt, which has a great work function, as an electrode material in direct contact with the dielectric film improves electrical performances of the device; second, the inhibition of residue production in Pt film patterning and the use of a simple etch back process can simplify the fabrication process; third, the prevention of oxygen diffusion by the oxygen diffusion barrier and the first bottom electrode during the formation of the dielectric film, which prevents oxidation of the plug layer, improves device performance; and fourth, by minimizing a contact area between a Pt film and a Ru film, and as RuOx film is formed by the oxygen diffused through the Pt film, degradation of the capacitor during formation of the dielectric film can be prevented.

It will be apparent to those skilled in the art that various modifications and variations of the present invention can be made without departing from the spirit or scope of the invention. Thus, it is intended that the present invention cover the modifications and variations of this invention provided they come within the scope of the appended claims and their equivalents.

We claim:

1. A semiconductor device having a capacitor with a bottom electrode, comprising:

a substrate having an interlayer insulating layer formed thereon, the interlayer insulating layer having a contact hole formed therein, and a plug disposed in the contact hole;

a first bottom electrode formed on the interlayer insulating layer and over the contact hole;

a first oxygen diffusion barrier formed on the first bottom electrode;

a second bottom electrode formed on the first oxygen diffusion barrier;

the first bottom electrode, first oxygen diffusion barrier and second bottom electrode defining a bottom electrode pattern; and a third bottom electrode formed on sidewalls of the first bottom electrode, the first oxygen diffusion barrier and the second bottom electrode and having a height greater than a height of the bottom electrode pattern.

2. The semiconductor device of claim 1, wherein the first bottom electrode is formed of a material which conducts as an oxide.

3. The semiconductor device of claim 2, wherein the first bottom electrode is form from one of Ru, Ir, Rh, Os, Sn, and a mixture thereof.

4. The semiconductor device of claim 1, wherein the first bottom electrode is formed of a first material having a first work function, the second bottom electrode is formed of a second material having a second work function, and the second work function is greater than the first work function.

5. The semiconductor device of claim 1, wherein the second bottom electrode has a thickness of 10 nm+−5%.

6. The semiconductor device of claim 1, wherein the first bottom electrode, the first oxygen diffusion barrier, and the second bottom electrode have a same bottom surface area.

7. The semiconductor device of claim 1, wherein the first bottom electrode is formed of a material which conducts as an oxide;

the first bottom electrode is formed of a first material having a first work function, the second bottom electrode is formed of a second material having a second work function, and the second work function is greater than the first work function; and the third bottom electrode has a height which greater than a combined height of the first bottom electrode, the first oxygen diffusion barrier and the second bottom electrode.

8. The semiconductor device of claim 1, wherein the first oxygen diffusion barrier is formed from one of silicon oxide and silicon nitride.

9. The semiconductor device of claim 1, wherein the second bottom electrode is formed of Pt.

10. The semiconductor device of claim 1, wherein the third bottom electrode is formed of Pt.

11. The semiconductor device of claim 1, further comprising:
   a second oxygen barrier layer formed between the plug and the first bottom electrode.

12. The semiconductor device of claim 11, wherein the second oxygen diffusion barrier is formed from one of TiN, TiW, TaN and TiAlN.

13. The semiconductor device of claim 11, wherein the second oxygen diffusion barrier is formed in the contact hole in the interlayer insulating layer.

14. The semiconductor device of claim 1, further comprising:
   a first adhesive between the first bottom electrode and the first oxygen diffusion barrier; and
   a second adhesive between the first oxygen diffusion barrier and the second bottom electrode.

15. The semiconductor device of claim 1, further comprising:
   a dielectric film formed on the third bottom electrode, the second bottom electrode and at least a portion of the interlayer insulating layer.

* * * * *